United States Patent
Liu (10) Patent No.: US 9,632,382 B2
(45) Date of Patent: Apr. 25, 2017

(54) ARRAY SUBSTRATE COMPRISING A BARRIER LAYER PATTERN AND THE METHOD FOR MANUFACTURING THE SAME, AND LIQUID CRYSTAL DISPLAY DEVICE

(71) Applicant: BOE TECHNOLOGY GROUP CO., LTD., Beijing (CN)

(72) Inventor: Xiang Liu, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 185 days.

(21) Appl. No.: 14/105,600

(22) Filed: Dec. 13, 2013

(65) Prior Publication Data

US 2014/0168556 A1    Jun. 19, 2014

(30) Foreign Application Priority Data

Dec. 14, 2012  (CN) .......................... 2012 1 0544983

(51) Int. Cl.
*H01L 27/12* (2006.01)
*H01L 29/45* (2006.01)
*G02F 1/1368* (2006.01)

(52) U.S. Cl.
CPC .......... *G02F 1/1368* (2013.01); *H01L 27/124* (2013.01); *H01L 27/127* (2013.01);
(Continued)

(58) Field of Classification Search
CPC ................................................ H01L 27/1251
See application file for complete search history.

(56) References Cited

U.S. PATENT DOCUMENTS

| 8,928,828 B2 | 1/2015 | Guo et al. |
| 2009/0108256 A1* | 4/2009 | Kwak ................. H01L 27/1225 257/43 |

(Continued)

FOREIGN PATENT DOCUMENTS

| CN | 102623461 A | 8/2012 |
| CN | 102629609 A | 8/2012 |

(Continued)

OTHER PUBLICATIONS

Chinese First Action Dated Oct. 10, 2014, Application No. 201210544983.6, 7 Pages.

*Primary Examiner* — Paul Lee
(74) *Attorney, Agent, or Firm* — Brooks Kushman P.C.

(57) ABSTRACT

The example of present invention provides an array substrate, the method for manufacturing the same, and a liquid crystal display device, wherein the array substrate comprises: a gate electrode, a gate insulating layer, a barrier layer pattern and an active semiconductor layer pattern formed by metal oxide semiconductor which are located on the gate insulating layer, a semiconductor protecting layer which covers the barrier layer pattern and the active semiconductor layer pattern, and has via holes at positions corresponding to the barrier layer pattern and the active semiconductor layer pattern; a data wire, a source electrode and a drain electrode formed by metal Cu, which are located at via holes. Metal Cu is used to form the data wire, the source electrode and the drain electrode, and the metal oxide semiconductor is used as the barrier layer for the metal Cu, and as a result, the diffusion of metal Cu into the layers such as the gate insulating layer etc., is prevented in the manufacturing process of TFT.

19 Claims, 7 Drawing Sheets

(52) U.S. Cl.
CPC ...... *H01L 27/1225* (2013.01); *H01L 27/1251* (2013.01); *H01L 29/45* (2013.01)

(56) References Cited

U.S. PATENT DOCUMENTS

| | | | |
|---|---|---|---|
| 2009/0184315 A1* | 7/2009 | Lee | H01L 27/1296 257/43 |
| 2010/0155721 A1* | 6/2010 | Lee | H01L 29/7869 257/43 |
| 2010/0308326 A1* | 12/2010 | Kim | H01L 21/02554 257/43 |
| 2011/0199551 A1* | 8/2011 | Asai | H01L 27/3248 349/42 |
| 2012/0211753 A1* | 8/2012 | Kim | H01L 27/1288 257/59 |
| 2014/0061635 A1 | 3/2014 | Liu | |
| 2014/0071364 A1 | 3/2014 | Liu et al. | |
| 2014/0125901 A1 | 5/2014 | Tong et al. | |

FOREIGN PATENT DOCUMENTS

| | | |
|---|---|---|
| CN | 102629611 A | 8/2012 |
| CN | 102629628 A | 8/2012 |
| CN | 102709239 A | 10/2012 |

\* cited by examiner

ARRAY SUBSTRATE COMPRISING A BARRIER LAYER PATTERN AND THE METHOD FOR MANUFACTURING THE SAME, AND LIQUID CRYSTAL DISPLAY DEVICE

CROSS-REFERENCE TO RELATED APPLICATIONS

This application claims priority to Chinese application No. 201210544983.6 filed Dec. 14, 2012, which is hereby incorporated by reference in its entirety.

TECHNICAL FIELD

The present invention relates to the liquid display technology, and especially relates to an array substrate and the method for manufacturing the same, and a liquid crystal display device.

BACKGROUND

Thin film transistor liquid crystal display (TFT-LCD) has the advantages of small size, low energy consumption, no radiation, etc. As the size of the TFT-LCD increases and resolution improves, a drive circuit of higher frequency is used to improve the display quality, which leads to a more severe image signal delay of large size, high resolution TFT-LCD. The delay of the TFT-LCD signal is mainly decided by T=RC, wherein R is the signal resistance and C is the relative capacitance. Nowadays, the gate electrode, the gate electrode scanning line and data wire of the TFT-LCD are usually made by using metals such as Ta, Cr, Mo, etc. or the alloys thereof having stable chemical properties and high resistivity as the material of metal electrode. With the size and resolution of TFT-LCD increasing, the length of the gate electrode scanning line also increases, and the signal delay time also increases. Once the signal delay increases to certain level, some pixels will be inadequately charged, which leads to unevenness in the brightness, decrease in the contrast of the TFT-LCD, and affects the image display quality greatly.

As the size of the liquid crystal display increases, the frequency of the drive circuit also has to be increased. The mobility of the amorphous-silicon TFT(thin film transistor) is about 0.5 $cm^2/V \cdot S$. However, when the size of the liquid crystal display exceeds 80 inch and the drive frequency is 120 Hz, a mobility of no less than 1 $cm^2/V \cdot S$ is necessary.

Metal oxide TFT (amorphous IGZO) is large in mobility, good in evenness, transparent and simple in manufacture process, can meet the requirement of the large size liquid crystal display and organic active electroluminescence and meet the requirement of large size, high refresh frequency LCD and OLED for high mobility. When metal Cu is used to form the drain electrode and the source electrode of TFT, Cu diffuses to the semiconductor layer, the gate insulating layer and the semiconductor protecting layer, which will affect the performance of TFT greatly. Therefore, before depositing the metal Cu thin film, barrier layer has to be deposited first.

The prior art has the following problems: when using amorphous IGZO to make TFT, a barrier layer is usually formed on the amorphous IGZO (semiconductor layer) to avoid that the amorphous IGZO is damaged when forming the Cu source electrode and drain electrode. However, this will add another patterning process, and when wet-etching metal Cu, since the etching rate of the metal Cu and that of the barrier layer are of great difference, the barrier layer will remain a bit after being etched and other thin films deposited thereupon will be badness in covering.

SUMMARY

The technical problem the present invention intend to solve is providing an array substrate and the method for manufacturing the same, and a liquid crystal display device, to solve the problem of the prior art that when metal Cu is used to make the drain electrode and the source electrode of TFT, the metal Cu diffuses to the semiconductor layer, the gate insulating layer and the semiconductor protecting layer to affect the performance of TFT.

To solve the problem mentioned above, the example of the present invention provides an array substrate that comprises:

a gate electrode;

a gate insulating layer;

a barrier layer pattern and an active semiconductor layer pattern formed by metal oxide semiconductor, the barrier layer pattern and the active semiconductor layer pattern being located on the gate insulating layer;

a semiconductor protecting layer configured to cover the barrier layer pattern and the active semiconductor layer pattern, and via holes being formed at positions corresponding to the barrier layer pattern and the active semiconductor layer pattern; and a data wire, a source electrode and a drain electrode formed by metal Cu, wherein, the data wire connects the barrier layer pattern through a corresponding via hole, and the source electrode and the drain electrode connect the active semiconductor layer pattern through a corresponding via holes respectively.

Of the array substrate, the gate insulating layer includes two layers, the first layer is a silicon nitride layer and the second layer is a silicon oxide layer which contacts the active semiconductor layer pattern or the semiconductor protecting layer directly.

Of the array substrate, the semiconductor protecting layer includes two layers, the first layer is a silicon nitride layer, the second layer is an oxide layer, and the oxide is metal oxide or silicone oxide, the first layer contacts the active semiconductor layer pattern directly.

Of the array substrate, a transparent conductive material is used to form a connecting wire between data wire and source electrode, the connecting wire between data wire and source electrode connects the data wire and the source electrode at a connecting via hole of data wire and source electrode.

Of the array substrate, a thin film is formed by a transparent conductive material at a source electrode via hole, to cover the source electrode at the source electrode via hole.

Of the array substrate, a thin film is formed by a transparent conductive material at a drain electrode via hole, to cover the drain electrode at the drain electrode via hole.

A method for manufacturing an array substrate, comprising:

forming a gate electrode and a gate electrode scanning line through a patterning process;

forming a gate insulating layer;

forming a barrier layer pattern and an active semiconductor layer pattern of a metal oxide through a patterning process;

forming the semiconductor protecting layer with via holes through a patterning process;

forming patterns of a data wire pattern, a source electrode and a drain electrode made of metal Cu through a patterning process, wherein, the data wire connects the barrier layer pattern through a corresponding via hole, and the source electrode and the drain electrode connect the active semiconductor layer pattern through a corresponding via holes respectively; and forming a connecting wire between data wire and source electrode, and a transparent pixel electrode through a patterning process.

Of the method for manufacturing an array substrate, via holes are formed at positions corresponding to the barrier layer pattern and the active semiconductor layer pattern.

Of the method for manufacturing an array substrate, the step of "forming a connecting wire between data wire and source electrode, and a transparent pixel electrode through a patterning process" further comprising:

a transparent conductive material being used to form the connecting wire between data wire and source electrode, the connecting wire between data wire and source electrode connecting the data wire and the source electrode at a connecting via hole of data wire and source electrode.

A liquid crystal display device, comprising the above mentioned array substrate.

The effects achieved by the technical solution of the present invention are as follows: metal Cu is used to form the data wire, the source electrode and the drain electrode, and the metal oxide semiconductor is used as the barrier layer for the metal Cu, and as a result, the diffusion of metal Cu to the layers such as the gate insulating layer is prevented in the manufacturing process of TFT.

The present invention will be more clearly understood from the description of preferred embodiments as set forth below, with reference to the accompanying drawings.

1: glass substrate; 2: gate electrode; 3: gate insulating layer; 4: active semiconductor layer pattern; 5: semiconductor protecting layer; 6: source electrode; 7: drain electrode; 8: transparent pixel electrode; 9: connecting wire between data wire and source electrode; 10: connecting via hole of data wire and source electrode; 11: barrier layer pattern; 12: data wire; 13: gate electrode scanning line; 14: source electrode via hole; 15: drain electrode via hole.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In order to make clearer of the technical problem intended to solve, technical solution and advantages of the present invention, the specific description is provided below with reference to the drawings and examples.

In the present invention, metal Cu with low resistance is used to form the source electrode 6 and the drain electrode 7, the gate electrode scanning line 13 and the data wire 12, to improve the condition of the metal Cu wiring in the array substrate.

Figure 1:
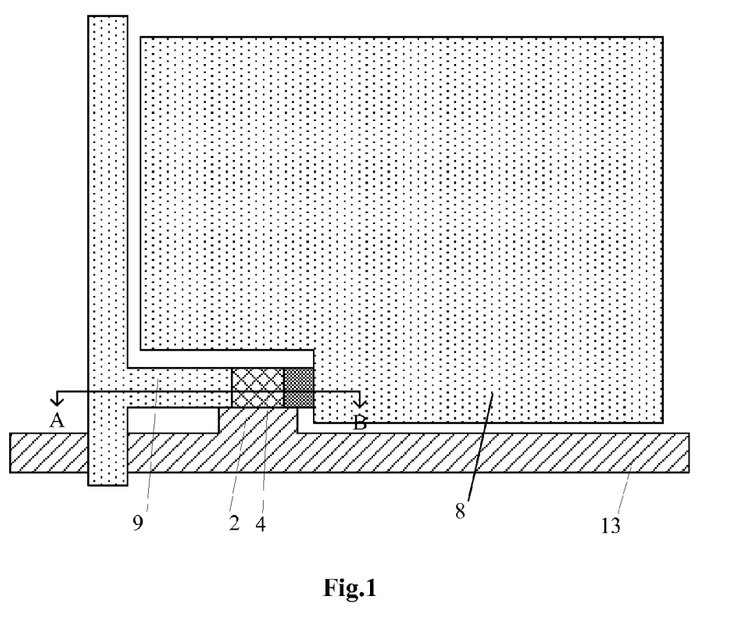
FIG. 1 is the structural plan diagram of an array substrate of an example of the present invention.
Figure 10:
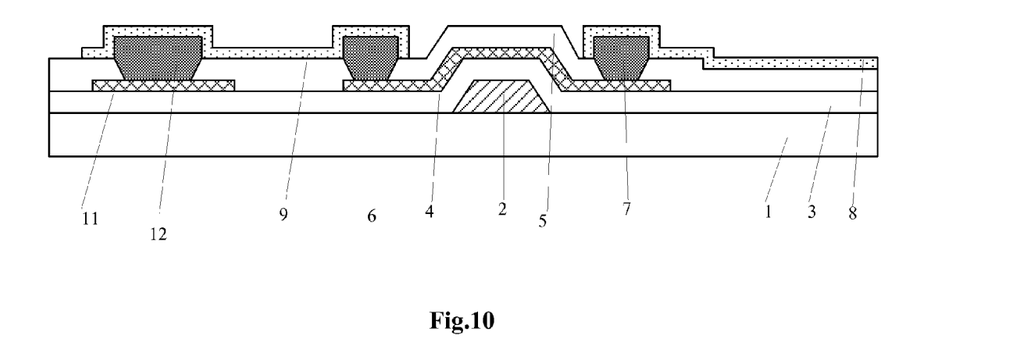
FIG. 10 is the cross-section diagram of forming the transparent pixel electrode, and the connecting wire between data wire and source electrode of an array substrate of an example of the present invention through a one-time patterning process.

An example of the present invention provides an array substrate, as shown in FIGS. 1 and 10, comprising:

a gate electrode 2;

a gate insulating layer 3;

a barrier layer pattern 11 for Cu and an active semiconductor layer pattern 4 made of metal oxide semiconductor, which were located on the gate insulating layer 3;

a semiconductor protecting layer 5 which covered the barrier layer pattern 11 for Cu and the active semiconductor layer pattern 4, and had via holes at positions corresponding to the barrier layer pattern 11 and the active semiconductor layer pattern 4; and a data wire 12, a source electrode 6 and a drain electrode 7 made of metal Cu, the data wire 12 connected the barrier layer pattern 11 through the corresponding via hole, and the source electrode 6 and the drain electrode 7 connected the active semiconductor layer pattern 4 through the corresponding via holes respectively.

Of the provided technology, metal Cu was used to form the data wire 12, the source electrode 6 and the drain electrode 7, and the metal oxide semiconductor was used as the barrier layer for the metal Cu, and as a result, the diffusion of metal Cu to the layers such as the gate insulating layer 3 was prevented in the manufacturing process of TFT.

In one preferred example, the gate insulating layer 3 included two layers, the first layer is a silicon nitride layer (SiNx) and the second layer is a silicon oxide layer (SiOx) which contacted the active semiconductor layer pattern 4 or the semiconductor protecting layer 5 directly.

In one preferred example, via holes included:

the first via hole, namely the connecting via hole of data wire and source electrode 10;

the second via hole, namely the source electrode via hole 14; and the third via hole, namely the drain electrode via hole 15.

Figure 6:
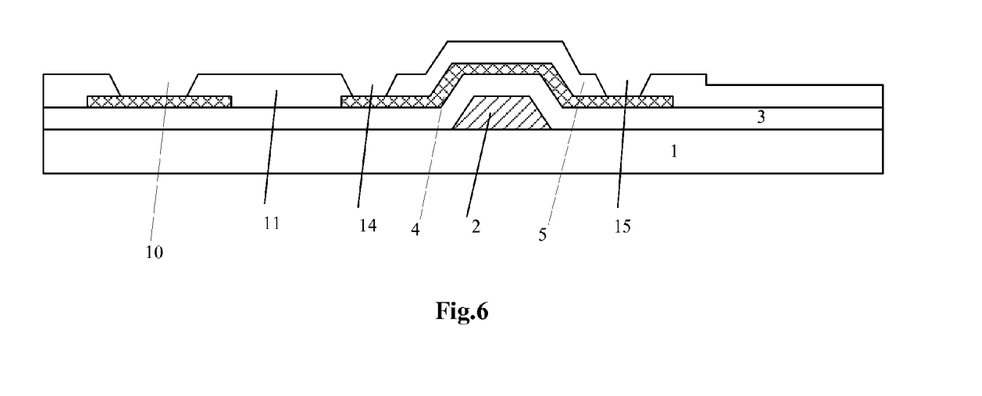
FIG. 6 is the cross-section diagram of forming the semiconductor protecting layer of an array substrate of an example of the present invention through a one-time patterning process.

Each via hole served as the contacting area of metal Cu with the metal oxide semiconductor, as shown in FIG. 6.

In one preferred example, transparent conductive material was used to form a connecting wire 9 between the data wire and the source electrode which connected the data wire 12 and the source electrode 6 at the via hole for connecting the data wire and the source electrode.

Figure 11:
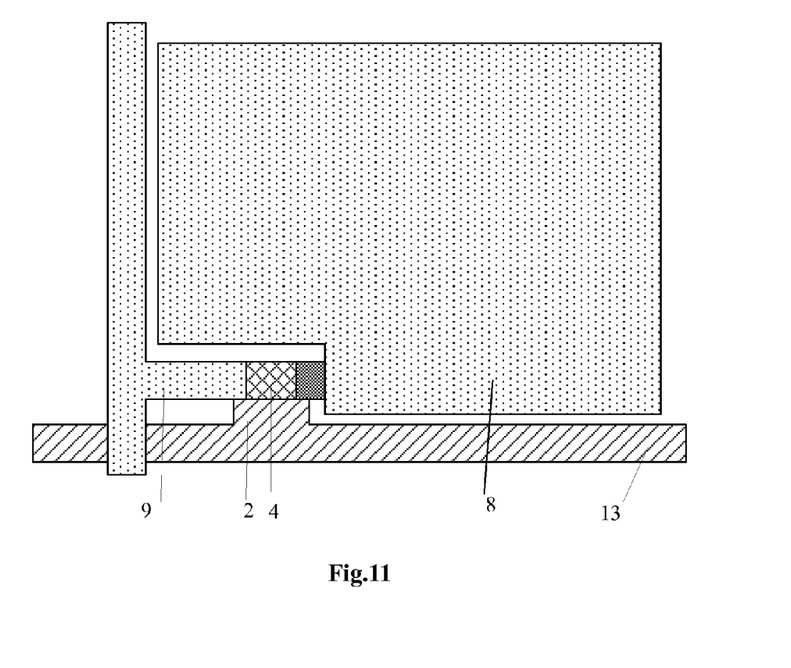
FIG. 11 is the plan of forming the transparent pixel electrode, and the connecting wire between data wire and source electrode of an array substrate of an example of the present invention through a one-time patterning process.
Figure 12:
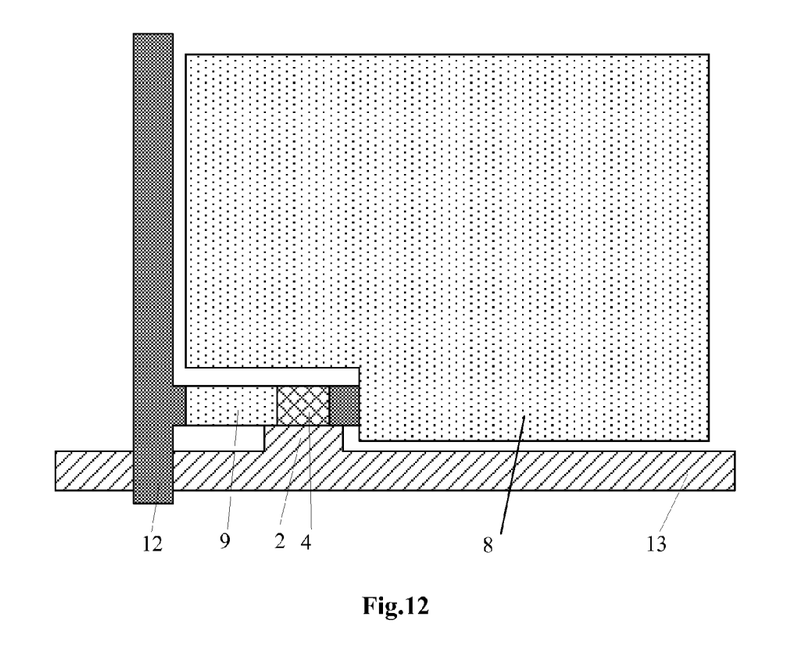
FIG. 12 is the structural diagram of the connecting wire between data wire and source electrode covering part of the data wire of an array substrate of an example of the present invention.

As shown in FIG. 11, the transparent conductive material covered the whole data wire 12, or as shown in FIG. 12, part of the data wire 12. The transparent conductive material specifically was indium tin oxide (ITO) or indium zinc oxide (IZO).

In one preferred example, transparent conductive material was used to form a thin film at the source electrode via hole, to cover the source electrode 6 at the source electrode via hole. The transparent conductive material specifically was ITO or IZO.

In one preferred example, transparent conductive material was used to form a thin film at the drain electrode via hole, to cover the drain electrode 7 at the drain electrode via hole. The transparent conductive material specifically was ITO or IZO.

In one preferred example, the semiconductor protecting layer 5 included two layers, the first layer was a silicon nitride layer, the second layer was an oxide layer, and the oxides is metal oxides or silicon oxides. The first layer contacted the active semiconductor layer pattern 4 directly.

The semiconductor protecting layer 5 included two layers, the first layer was a silicon nitride layer and the second layer was an oxides layer, and the oxides could be a metal oxide insulator such as $Al_2O_3$, or silicon oxides, such as silica or silicon oxynitride. The function of semiconductor protecting layer 5 lied in preventing the active semiconductor layer pattern 4 from etching off during the process of etching the source electrode 6 and drain electrode 7.

Applying the technology provided by an example, in an array substrate manufacturing situation, metal oxide semiconductor was used to form the barrier layer pattern 11 for Cu and the active semiconductor pattern 4, and the metal Cu was used to form the data wire 12, the source electrode 6 and the drain electrode 7. The method specifically comprised:

Step 1: depositing a gate metal thin film with a thickness of 4000 Å~15000 Å on a glass substrate or a quartz substrate by sputtering or thermal evaporation, wherein the gate metal thin film was formed by metal or alloy such as Cr, W, Cu, Ti, Ta, Mo, etc., or composite gate metal thin film formed by multiple metal layers.

Figure 2:
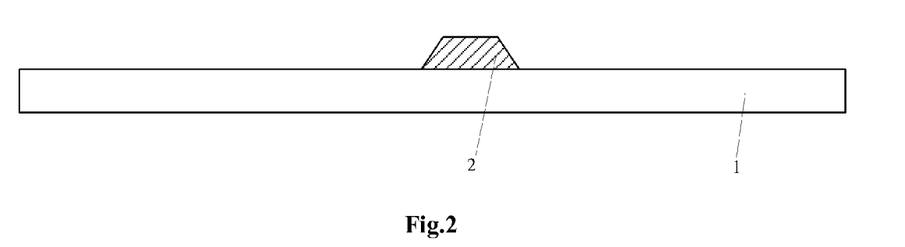
FIG. 2 is the cross-section diagram of forming the gate electrode and the gate electrode scanning line of an array substrate of an example of the present invention through a one-time patterning process.
Figure 3:
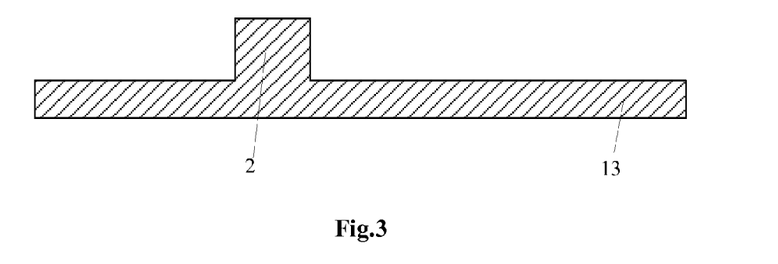
FIG. 3 is the plan diagram of forming the gate electrode and the gate electrode scanning line of an array substrate of an example of the present invention through a one-time patterning process.

In the first one-time patterning process, a gate electrode 2 and a gate electrode scanning line 13 were formed. FIGS. 2 and 3 show respectively the cross-section diagram and the plan diagram of the array substrate after this one-time patterning process.

Step 2: Depositing continuously a gate insulating layer 3 with a thickness of 2000 Å~5000 Å by PECVD. The gate insulating layer could be formed by oxides, nitrides or oxynitrides, for example, the gate insulating layer could be formed by silicon oxide, silicon nitride or silicon oxynitride.

In order to improve the performance of the TFT, the gate insulating layer 3 included two layers, the first layer was SiNx, the second layer was SiOx which contacted the active semiconductor layer pattern 4 and the semiconductor protecting layer 5 directly.

Step 3: Depositing continuously a metal oxide semiconductor layer with a thickness of 50 Å~1000 Å by sputtering on the gate insulating layer 3. Specifically, amorphous IGZO, HIZO, IZO, a-InZnO, a-InZnO, ZnO:F, $In_2O_3$:Sn, $In_2O_3$:Mo, $Cd_2SnO_4$, ZnO:AL, $TiO_2$:Nb, Cd—Sn—O or other metal oxides could be used.

Figure 4:
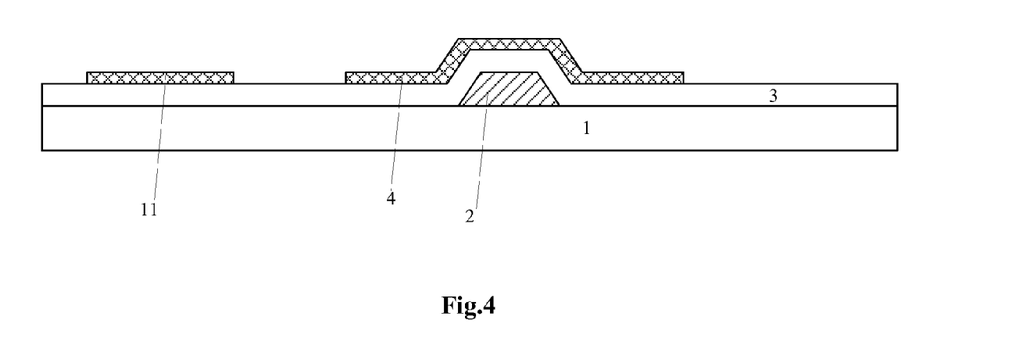
FIG. 4 is the cross-section diagram of forming the barrier layer pattern and the active semiconductor layer pattern of an array substrate of an example of the present invention through a one-time patterning process.
Figure 5:
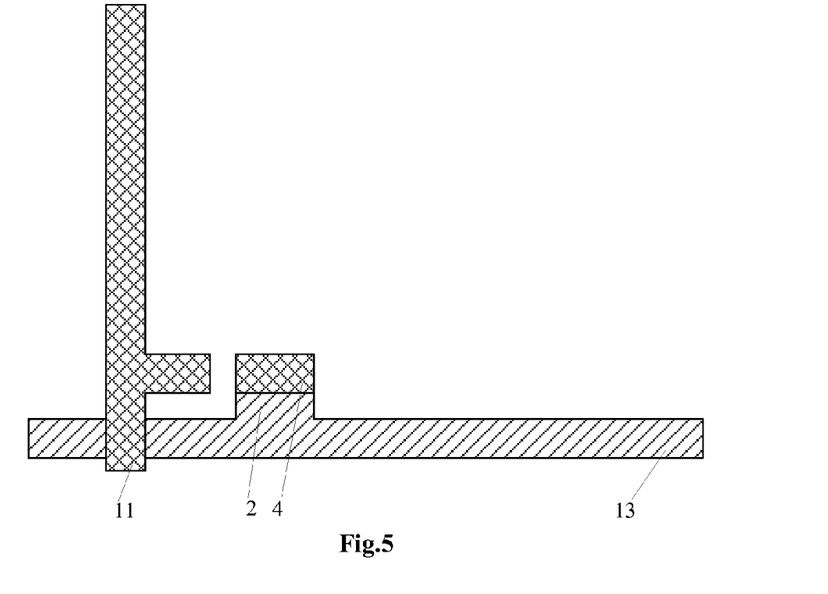
FIG. 5 is the plan diagram of forming the barrier layer pattern and the active semiconductor layer pattern of an array substrate of an example of the present invention through a one-time patterning process.

In the second one-time patterning process, a barrier layer pattern 11 and an active semiconductor layer pattern 4 were formed. FIGS. 4 and 5 shows respectively the cross-section diagram and the plan diagram of the array substrate after this one-time patterning process.

The barrier layer pattern 11 functioned as the barrier layer and increased the adhesion of the relevant electrodes and the metal Cu thin film, and further prevented the metal Cu ion diffusing to the relevant layers such as the gate insulating layer 3.

Step 4: depositing a semiconductor protecting layer 5 with a thickness of 500 Å~3000 Å by PEVCD onto the array substrate. The semiconductor protecting layer 5 could be oxides or nitrides, and oxides could be a metal oxide insulator such as $Al_2O_3$, or silicon oxides, such as silica or silicon oxynitride, and nitrides could be silicon nitride. As regarding to the semiconductor protecting layer 5, a double layer barrier structure could be used. And in the double layer barrier structure, the first layer was silicon nitride and the second layer was oxides which could be an insulator of the metal oxide such as $Al_2O_3$, or silicon oxide such as silica or silicon oxynitride. The first layer contacted the active semiconductor layer pattern directly.

In the third one-time patterning process, the first via hole, the second via hole and the third via hole were formed, wherein the first via hole was a connecting via hole of data wire and source electrode 10, the second via hole was a source electrode via hole 14, and the third via hole was a drain electrode via hole 15.

Figure 7:
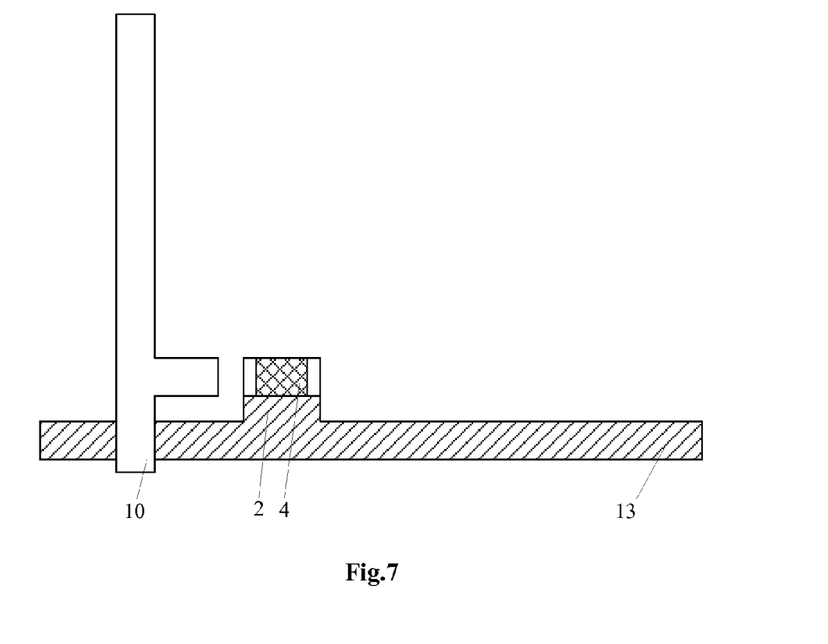
FIG. 7 is the plan diagram of forming the semiconductor protecting layer of an array substrate of an example of the present invention through a one-time patterning process.

The cross sectional diagram and the plan diagram are shown in FIGS. 6 and 7. Each via hole served as the contacting area of metal Cu and metal oxide semiconductor.

Step 5: depositing a source/drain metal layer with a thickness of 2000 Å~4000 Å by sputtering or thermal evaporation on the array substrate wherein metal Cu was used specifically.

Figure 8:
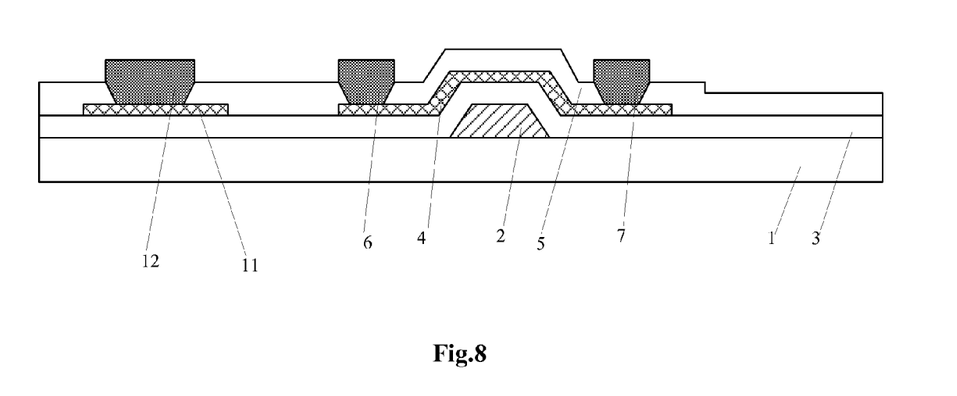
FIG. 8 is the cross-section diagram of forming the data wire, the source electrode and the drain electrode of an array substrate of an example of the present invention through a one-time patterning process.
Figure 9:
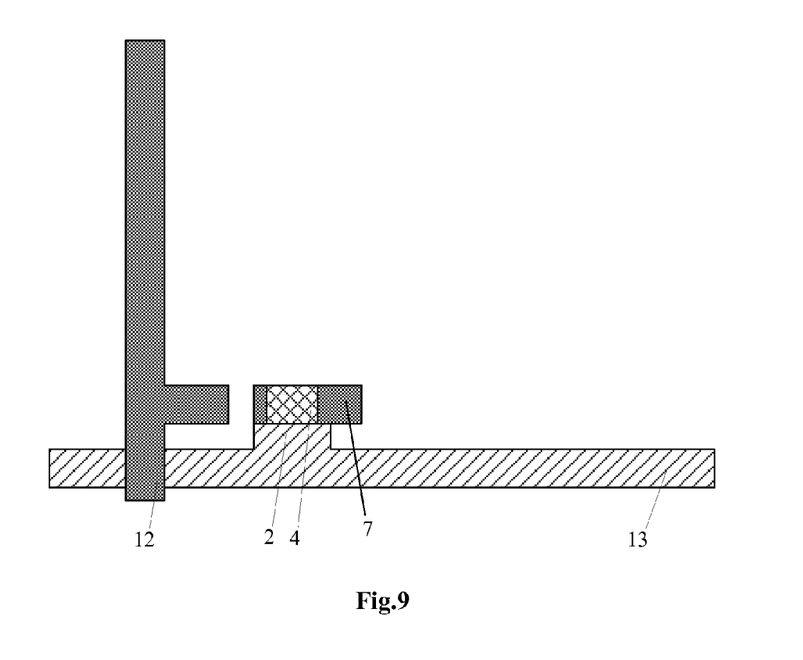
FIG. 9 is the plan diagram of forming the data wire, the source electrode and the drain electrode of an array substrate of an example of the present invention through a one-time patterning process.

In the fourth one-time patterning process, patterns of a data wire 12, a source electrode 6 and a drain electrode 7 were formed. The cross-section diagram and the plan diagram are shown in FIGS. 8 and 9, respectively.

Step 6: depositing a transparent conductive layer with a thickness of 300 Å~1500 Å by sputtering and thermal evaporation on the array substrate. The material of the transparent conductive layer could be ITO, IZO, or other transparent metal oxides.

In the fifth one-time patterning process, the transparent pixel electrode 8, the connecting wire between data wire and source electrode 9 were formed. The cross-section diagram is shown in FIG. 10. The ITO or IZO used in the transparent pixel electrode 8 could cover the whole drain electrode 7 to reduce the poor contact between drain electrode 7 and the transparent pixel electrode 8, to guarantee the adequate contact of the drain electrode 7 and the transparent pixel electrode 8, and to protect the Cu thin film that forms the drain electrode 7. The ITO or IZO used in transparent pixel electrode 8 also can partly cover the drain electrode 7.

As shown in FIG. 11, transparent conductive material (specifically, ITO or IZO) was used in the connecting wire between data wire and drain electrode 9, which covered the whole data wire 12. Or as shown in FIG. 12, the connecting wire between data wire and drain electrode 9 could also cover part of the data wire 12.

An example of the present invention also provides a method for manufacturing an array substrate wherein metal Cu was used to form a data wire 12, a source electrode 6 and a drain electrode 7, and metal oxide semiconductor was used to form the barrier layer pattern 11 for Cu, the method comprised:

forming a gate electrode 6 and a gate electrode scanning line 13 through a one-time patterning process;

forming a gate insulating layer;

forming a barrier layer pattern 11 and an active semiconductor layer pattern 4 through a one-time patterning process;

forming the semiconductor protecting layer 5 with via holes through a one-time patterning process;

forming a pattern of a data wire 12, a source electrode 6 and a drain electrode 7 through a one-time patterning process, wherein, the data wire connects the barrier layer pattern 11 through the corresponding via hole, and the source electrode and the drain electrode connect the active semiconductor layer pattern through the corresponding via holes respectively; and forming a connecting wire between data wire and source electrode 9, and a transparent pixel electrode 8 through a one-time patterning process.

Applying the technology provided by an example, in an array substrate manufacturing situation, the method comprised:

forming a gate electrode 6 and a gate electrode scanning line 13 through the first one-time patterning process;

forming a gate insulating layer;

forming a barrier layer pattern 11 for Cu and an active semiconductor layer pattern 4 through the second one-time patterning process; and forming the semiconductor protecting layer 5 with via holes through the third one-time patterning process, wherein the via holes were formed at area corresponding to the barrier layer pattern 11 and the active semiconductor pattern 4. Contacting areas of Cu on metal oxide semiconductor of the barrier layer pattern 11 and the active semiconductor pattern 4 were formed in the semiconductor protecting layer 5, including: contacting area of the data wire through the first via hole, contacting area of the source electrode through the second via hole, contacting area of the drain electrode through the third via hole. The semiconductor protecting layer 5 now served as the protecting layer for the active semiconductor layer pattern 4 to improve the stability of the metal oxide TFT.

In the fourth one-time patterning process, patterns of a data wire 12, a source electrode 6 and a drain electrode 7 were formed.

In the fifth one-time patterning process, a connecting wire between data wire and source electrode 9, and a transparent pixel electrode 8 were formed. The transparent conductive material was used to form the connecting wire between data wire and source electrode 9 which connects the data wire 12 and the source electrode 6 at the first via hole. The transparent conductive material (specifically ITO or IZO) could cover the whole metal Cu thin film to ensure the adequate contact of drain electrode 7 and transparent pixel electrode 8 and to protect the metal Cu thin film. The transparent conductive material could also partly cover the metal Cu thin film, for example, the connecting wire between data wire and source electrode 9 also could cover part of the metal Cu thin film.

The one-time patterning process included technological process such as photoresist coating, exposing, developing, etching, stripping, etc., and finally a pattern was formed in the thin film in the one-time patterning process.

In the one-time patterning process, since the barrier layer pattern 11 formed by metal oxide semiconductor was used as the barrier layer for metal Cu, the diffusion of metal Cu into layers such as the gate insulating layer 3 was prevented in the manufacturing process the TFT. Moreover, the semiconductor protecting layer 5, the function of which was to prevent the active semiconductor layer 4 being etched off during the etching of the source electrode 6 and the drain electrode 7, was used to protect the active semiconductor layer pattern 4.

An example of the present invention provides a liquid display device that comprised an array substrate, wherein the array substrate comprised:

a gate insulating layer 3;

a gate electrode 2;

a barrier layer pattern 11 for Cu and an active semiconductor layer pattern 4 made of metal oxide semiconductor, which are located on the gate insulating layer;

a semiconductor protecting layer 5 which covers the barrier layer pattern 11 for Cu and the active semiconductor layer pattern 4, and has via holes at positions corresponding to the barrier layer pattern 11 and the active semiconductor layer pattern 4; and a data wire, a source electrode and a drain electrode made of metal Cu, wherein, the data wire connects the barrier layer pattern through a corresponding via hole, the source electrode and the drain electrode connect the active semiconductor layer pattern through corresponding via holes respectively.

The advantages acquired by applying the present solution are: metal Cu is used to form the data wire 12, the source electrode 6 and the drain electrode 7, and the metal oxide semiconductor is used as the barrier layer pattern 11 for the metal Cu, and as a result, the diffusion of metal Cu into the layers such as the gate insulating layer 3, the active semiconductor layer pattern 4, etc., is prevented in the manufacturing process of TFT. Since the metal oxide TFT (amorphous IGZO) is large in mobility, good in evenness, transparent and simple in manufacture process, it can meet the requirement of the large size liquid crystal display and the organic active electroluminescence and meet the requirement of large size, high refresh frequency LCD and OLED for high mobility Disclosed above are the preferred examples of the present invention. It should be understood that a person skilled in the art can make improvement and modification without deviating from the theory of the present invention, which should also be considered as being within the scope of the present invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An array substrate, comprising:
   a gate electrode;
   a gate insulating layer;
   a barrier layer pattern and an active semiconductor layer pattern, with each of the barrier layer pattern and an active semiconductor layer pattern being formed of a metal oxide semiconductor and being directly located on the top surface of the gate insulating layer, and wherein the barrier layer pattern is configured to increase an adhesion of metal Cu thin film and prevent metal Cu ion diffusing into the gate insulating layer;
   a semiconductor protecting layer, configured to cover the barrier layer pattern and the active semiconductor layer pattern, with via holes being formed in the semiconductor protecting layer and at top surface of the barrier layer pattern and the active semiconductor layer pattern; and
   a data wire, a source electrode and a drain electrode made of metal Cu, wherein the data wire connects to the barrier layer pattern through metal Cu in a corresponding via hole, the source electrode and the drain electrode connect to the active semiconductor layer pattern through metal Cu in corresponding via holes respectively,
   wherein the data wire fills the data wire corresponding via hole, the source electrode fills the source electrode corresponding via hole and the drain electrode fills the drain electrode corresponding via hole.

2. The array substrate according to claim 1, wherein, the gate insulating layer includes two layers, the first layer is a silicon nitride layer and the second layer is a silicon oxide layer which contacts the active semiconductor layer pattern or the semiconductor protecting layer directly.

3. The array substrate according to claim 1, wherein, the semiconductor protecting layer includes two layers, the first layer is a silicon nitride layer and the second layer is an oxide layer, the oxide layer is a metal oxide layer or a silicon oxide layer, the first layer contacts the active semiconductor layer pattern directly.

4. The array substrate according to claim 1, wherein, a transparent conductive material is used to form a connecting wire between data wire and source electrode, the connecting wire between data wire and source electrode connects the data wire and the source electrode at a connecting via hole of data wire and source electrode.

5. The array substrate according to claim 1, wherein,
   a thin film is formed by a transparent conductive material at a source electrode via hole, to cover the source electrode at the source electrode via hole.

6. The array substrate according to claim 1, characterized in that,
   a thin film is formed by a transparent conductive material at a drain electrode via hole, to cover the drain electrode at the drain electrode via hole.

7. A method for manufacturing an array substrate, wherein the array substrate comprises:
   a gate electrode;
   a gate insulating layer;
   a barrier layer pattern and an active semiconductor layer pattern, with each of the barrier layer pattern and an active semiconductor layer pattern being formed of a metal oxide semiconductor and being directly located on the top surface of the gate insulating layer, and wherein the barrier layer pattern is configured to increase an adhesion of metal Cu thin film and prevent metal Cu ion diffusing into the gate insulating layer;
   a semiconductor protecting layer, configured to cover the barrier layer pattern and the active semiconductor layer pattern, with via holes being formed in the semiconductor protecting layer and at top surface of the barrier layer pattern and the active semiconductor layer pattern; and
   a data wire, a source electrode and a drain electrode made of metal Cu, wherein the data wire connects to the barrier layer pattern through metal Cu in a corresponding via hole, the source electrode and the drain electrode connect to the active semiconductor layer pattern through metal Cu in corresponding via holes respectively,
   wherein the data wire fills the data wire corresponding via hole, the source electrode fills the source electrode corresponding via hole and the drain electrode fills the drain electrode corresponding via hole, and
   wherein the method comprises:
   forming the gate electrode and a gate electrode scanning line through a one-time patterning process;
   forming the gate insulating layer;
   forming the barrier layer pattern and the active semiconductor layer pattern of metal oxide semiconductor through a one-time patterning process;
   forming the semiconductor protecting layer with via holes through a one-time patterning process;
   forming patterns of data wire, the source electrode and the drain electrode made of metal Cu through a one-time patterning process, wherein, the data wire connects to the barrier layer pattern through metal Cu in a corresponding via hole, and the source electrode and the drain electrode connect to the active semiconductor layer pattern through metal Cu in corresponding via holes respectively; and
   forming a connecting wire between data wire and source electrode, and a transparent pixel electrode through a one-time patterning process.

8. The method according to claim 7, wherein, said via holes are formed at positions corresponding to the barrier layer pattern and the active semiconductor layer pattern.

9. The method according to claim 7, the step of forming a connecting wire between data wire and source electrode, and a transparent pixel electrode through a patterning process further comprising:
   a transparent conductive material being used to form the connecting wire between data wire and source electrode, the connecting wire between data wire and source electrode connecting the data wire and the source electrode at a connecting via hole of data wire and source electrode.

10. A liquid crystal display device, comprising the array substrate of claim 1.

11. The liquid crystal display device according to claim 10, wherein, the gate insulating layer includes two layers, the first layer is a silicon nitride layer and the second layer is a silicon oxide layer which contacts the active semiconductor layer pattern or the semiconductor protecting layer directly.

12. The liquid crystal display device according to claim 10, wherein, the semiconductor protecting layer includes two layers, the first layer is a silicon nitride layer and the second layer is an oxide layer, the oxide layer is a metal oxide layer or a silicon oxide layer, the first layer contacts the active semiconductor layer pattern directly.

13. The liquid crystal display device according to claim 10, wherein, a transparent conductive material is used to form a connecting wire between data wire and source electrode, the connecting wire between data wire and source electrode connects the data wire and the source electrode at a connecting via hole of data wire and source electrode.

14. The liquid crystal display device according to claim 10, wherein,
a thin film is formed by a transparent conductive material at a source electrode via hole, to cover the source electrode at the source electrode via hole.

15. The liquid crystal display device according to claim 10, characterized in that,
a thin film is formed by a transparent conductive material at a drain electrode via hole, to cover the drain electrode at the drain electrode via hole.

16. An array substrate, comprising:
a gate electrode;
a gate insulating layer;
a barrier layer pattern and an active semiconductor layer pattern, each of the barrier layer pattern and an active semiconductor layer being formed of a metal oxide semiconductor and being located on the same surface of the gate insulating layer, the barrier layer pattern being configured to increase an adhesion of metal Cu thin film and prevent metal Cu ion diffusing into the gate insulating layer;
a semiconductor protecting layer, configured to cover the barrier layer pattern and the active semiconductor layer pattern, the semiconductor protecting layer having a first via hole above a top surface of the barrier layer pattern and a second via hole and a third via hole above a top surface of the active semiconductor layer pattern; and
a data wire, a source electrode and a drain electrode, each of the data wire, the source electrode and the drain electrode being made of metal Cu, the data wire disposed within the first via hole and electrically connected with the barrier layer pattern through the metal Cu in the first via hole, the source electrode disposed within the second via hole and the drain electrode disposed within the third via hole, the source electrode and the drain electrode electrically connected with the active semiconductor layer pattern through the metal Cu in the second and third via holes respectively.

17. The array substrate according to claim 1, wherein the data wire connects directly to the barrier layer pattern and the source electrode and the drain electrode connect directly to the active semiconductor layer pattern.

18. The array substrate according to claim 16, wherein the data wire fills the data wire corresponding via hole, the source electrode fills the source electrode corresponding via hole and the drain electrode fills the drain electrode corresponding via hole.

19. The array substrate according to claim 18, wherein the data wire connects directly to the barrier layer pattern and the source electrode and the drain electrode connect directly to the active semiconductor layer pattern.

* * * * *